(12) United States Patent
Chang

(10) Patent No.: US 7,227,760 B1
(45) Date of Patent: Jun. 5, 2007

(54) FASTENING STRUCTURE FOR ADD-ON CARD

(75) Inventor: Lin-Wei Chang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/394,631

(22) Filed: Mar. 30, 2006

(51) Int. Cl.
*H05K 7/12* (2006.01)

(52) U.S. Cl. ............... 361/801; 361/759; 361/747; 361/726; 361/732; 312/223.2; 439/327

(58) Field of Classification Search ............ 361/801, 361/726, 747, 740, 759; 439/327; 312/332.1, 312/332.2
See application file for complete search history.

(56) References Cited

U.S. PATENT DOCUMENTS

| | | | | |
|---|---|---|---|---|
| 5,601,349 A | * | 2/1997 | Holt ..................... | 312/265.6 |
| 5,822,193 A | * | 10/1998 | Summers et al. .......... | 361/759 |
| 6,220,887 B1 | * | 4/2001 | Downs .................. | 439/377 |
| 6,608,765 B2 | * | 8/2003 | Vier et al. .............. | 361/801 |
| 6,618,263 B1 | * | 9/2003 | Kin-Wing et al. ......... | 361/759 |
| 6,700,791 B1 | * | 3/2004 | Zappacosta .............. | 361/759 |
| 7,002,811 B2 | * | 2/2006 | Jing et al. .............. | 361/801 |
| 7,126,828 B2 | * | 10/2006 | Beall et al. ............ | 361/801 |
| 2005/0148228 A1 | * | 7/2005 | Jing et al. .............. | 439/325 |

* cited by examiner

*Primary Examiner*—Dean Reichard
*Assistant Examiner*—Dameon E. Levi
(74) *Attorney, Agent, or Firm*—Peter F. Corless; Steven M. Jensen; Edwards Angell Palmer & Dodge LLP

(57) ABSTRACT

An add-on card fastening structure is proposed, which is used for fastening an add-on card on a housing of an electronic device, wherein the housing of the electronic device is provided with a first positioning portion and a first coupling portion. The add-on card fastening structure includes a body, a second positioning portion, a second coupling portion, a plurality of confining portions, and a stop portion. The second positioning portion is disposed on the body and positionally corresponds to the first positioning portion. The second coupling portion is disposed on the body and can be coupled to the first coupling portion. The plurality of confining portions are disposed on the body so as to confine the add-on card in the fastening structure. The stop portion is disposed on the body so as to stop any displacement of a top portion of the add-on card.

16 Claims, 6 Drawing Sheets

FASTENING STRUCTURE FOR ADD-ON CARD

BACKGROUND OF THE INVENTION

1. Field of the Invention

The present invention relates to a design of a fastening structure, and more particularly, to a fastening structure for fastening an add-on card in a housing of an electronic device.

2. Description of the Prior Art

With constant advancement and development of technology, electronic devices have become indispensable to modern people's daily lives. An electronic device (for example, a host computer or a server) is composed of plenty major components and parts, such as a disk drive, a power supply, and a motherboard, disposed inside the housing of the electronic device. The motherboard is equipped with various slots, for example, accelerated graphics port (AGP), peripheral component interconnect (PCI), and industrial standard architecture (ISA), into which a display card, a sound card, and a network interface card are inserted so as to enhance the functions of the electronic device.

FIG. 1 shows a three-dimensional view of an add-on card 11 disposed inside a housing 12 of an electronic device in a known manner. As shown in the figure, the add-on card 11 is inserted into a socket 14 on a motherboard 13 inside the housing 12 of the electronic device, whereas a supporting element 111 of the add-on card 11 is screwed on a frame 121 of the housing 12 of the electronic device using a tool, such that the add-on card 11 is secured in the housing 12 of the electronic device. However, the aforesaid method for installing the add-on card 11 in the housing 12 of the electronic device usually involves screwing/unscrewing plenty of screws 15 and using an auxiliary tool to do the assembly and disassembly work, thereby causing users much inconvenience.

In light of the aforesaid drawback of screwing/unscrewing, an add-on card fastening structure free of screwing/unscrewing is herein proposed. Referring to FIG. 2A, an add-on card fastening structure 2 free of screwing/unscrewing comprises a framework 21 and a fastener 22. The framework 21 is connected to a housing 4 of an electronic device. The fastener 22 is pivotally connected to two connecting plates 211 of the framework 21. The framework 21 is provided with a first confining portion 212 and a second confining portion 213. The first confining portion 212 comprises two protruding sheets 2121. The second confining portion 213 comprises two protruding sheets 2131. The first confining portion 212 and the second confining portion 213 are respectively provided with guiding grooves 2122, 2132 which are positioned correspondingly. The fastener 22 is equipped with a plurality of fastening grooves 222 which are formed by a plurality of L-shaped protruding plates 221. The fastening grooves 222 positionally correspond to the guiding grooves 2122 of the first confining portion 212 and the guiding grooves 2132 of the second confining portion 213. Referring to FIG. 2B, to install an add-on card 23 in the housing 4 of the electronic device, a user should move the add-on card 23 along the guiding grooves 2122, 2132 of the first and second confining portions 212, 213 of the framework 21, and then the user should insert the add-on card 23 into a socket 25 on a motherboard 24 in the housing 4 of the electronic device, and finally turn the fastener 22 in the direction of the arrow A, such that a top 231 of the add-on card 23 is fastened on the fastening grooves 222 of the fastener 22, and, at that point, the fastening of the add-on card 23 in position is completed. Both the guiding grooves 2122, 2132 of the framework 21 serve to hold the add-on card 23, whereas the fastening grooves 222 of the fastener 22 serve to position the add-on card 23, such that the add-on card 23 would not be loosened under the vibration of the housing 4 of the electronic device. Since the fastening structure 2 comprises the framework 21 having a holding function and the fastener 22 having a positioning function, the framework 21 and the fastener 22 have to be separately manufactured and then be assembled; in so doing, the manufacturing process is complex. Furthermore, since the framework 21 is connected to the housing 4 of the electronic device and made of a metallic material, the manufacturing cost is high.

Therefore, the problem to be solved here is to overcome the drawbacks of the aforesaid prior art.

SUMMARY OF THE INVENTION

In light of the drawbacks of the aforementioned prior art, it is a primary objective of the present invention to provide an add-on card fastening structure with both a holding function and a positioning function.

Another objective of the present invention is to provide an add-on card fastening structure which is integrally fabricated so as to shorten and simplify the manufacturing process.

Yet another objective of the present invention is to provide an add-on card fastening structure which can be assembled and disassembled without using any tool.

A further objective of the present invention is to provide an add-on card fastening structure for reducing the manufacturing cost.

In order to achieve the above objectives, the present invention provides an add-on card fastening structure for fastening an add-on card in a housing of an electronic device, wherein the housing comprises a first positioning portion and a first coupling portion. The fastening structure comprises a body, a second positioning portion, a second coupling portion, confining portions, and a stop portion. The second positioning portion is disposed on the body and positionally corresponds to the first positioning portion. The second coupling portion is disposed on the body and can be coupled to the first coupling portion. The confining portions are disposed on the body so as to confine the add-on card in the fastening structure. The stop portion is disposed on the body so as to stop any displacement of a top portion of the add-on card.

Preferably, the body, the second positioning portion, the second coupling portion, the confining portions, and the stop portion are integrally fabricated and made of plastics. The second positioning portion is a hook, and it positionally corresponds to the groove-like first positioning portion; furthermore, the hook may be L-shaped. If the second coupling portion is an opening, the first coupling portion will be a tenon. The confining portions may comprise a pair of rails which are spaced apart, such that a guiding groove would be formed therebetween. The confining portions and the stop portion of the body are aligned in a straight line.

Since the add-on card fastening structure of the present invention is integrally fabricated, it solves a drawback of the aforesaid prior art, that is, the framework and the fastener have to be separately manufactured before they are assembled and thus the assembly process is complex. In other words, the present invention simplifies and shortens the assembly process.

Furthermore, both the confining portions and the stop portion disposed on the add-on card fastening structure of the present invention serve to position an add-on card on the housing of an electronic device. As result, the present invention solves a drawback of the aforesaid prior art, that is, the installing/uninstalling of an add-on card on the housing of an electronic device in a known manner requires much screwing/unscrewing and involves using an auxiliary tool. In other words, the present invention enhances ease of use, as the installation/uninstallation of an add-on card can be carried out without adopting any additional locking component or using any tool.

BRIEF DESCRIPTION OF THE DRAWINGS

The present invention can be more fully understood by reading the following detailed description of the preferred embodiment, with reference made to the accompanying drawings, wherein.

DETAILED DESCRIPTION OF THE PREFERRED EMBODIMENTS

The following specific embodiment is provided to illustrate the present invention. Others skilled in the art can readily gain an insight into other advantages and features of the present invention based on the contents disclosed in this specification. The present invention can also be performed or applied in accordance with other different embodiments. Various modifications and changes based on different viewpoints and applications yet still within the scope of the present invention can be made in the details of the specification.

It should be noted that the accompanying drawings are simplified schematic diagrams and only show components relating to the present invention. In practice, the shape, quantity and size of the components may be changed if necessary.

A fastening structure 3 of the present invention is applicable to an electronic device, such as a desktop PC, a notebook computer or a server, for fastening an add-on card in the housing of an electronic device. Although a server is used in the embodiment described below, the scope of the present invention should not be limited thereto. Since all related electronic devices equipped with add-on cards, such as a desktop PC and a notebook computer, are known to any person skilled in the prior art, the appended drawings only show the part of an add-on card fastening structure directly relating to the present invention, but omit the irrelevant part, so as to describe the characteristics and structure of the present invention in a simple, clear and understandable manner.

Figure 1:
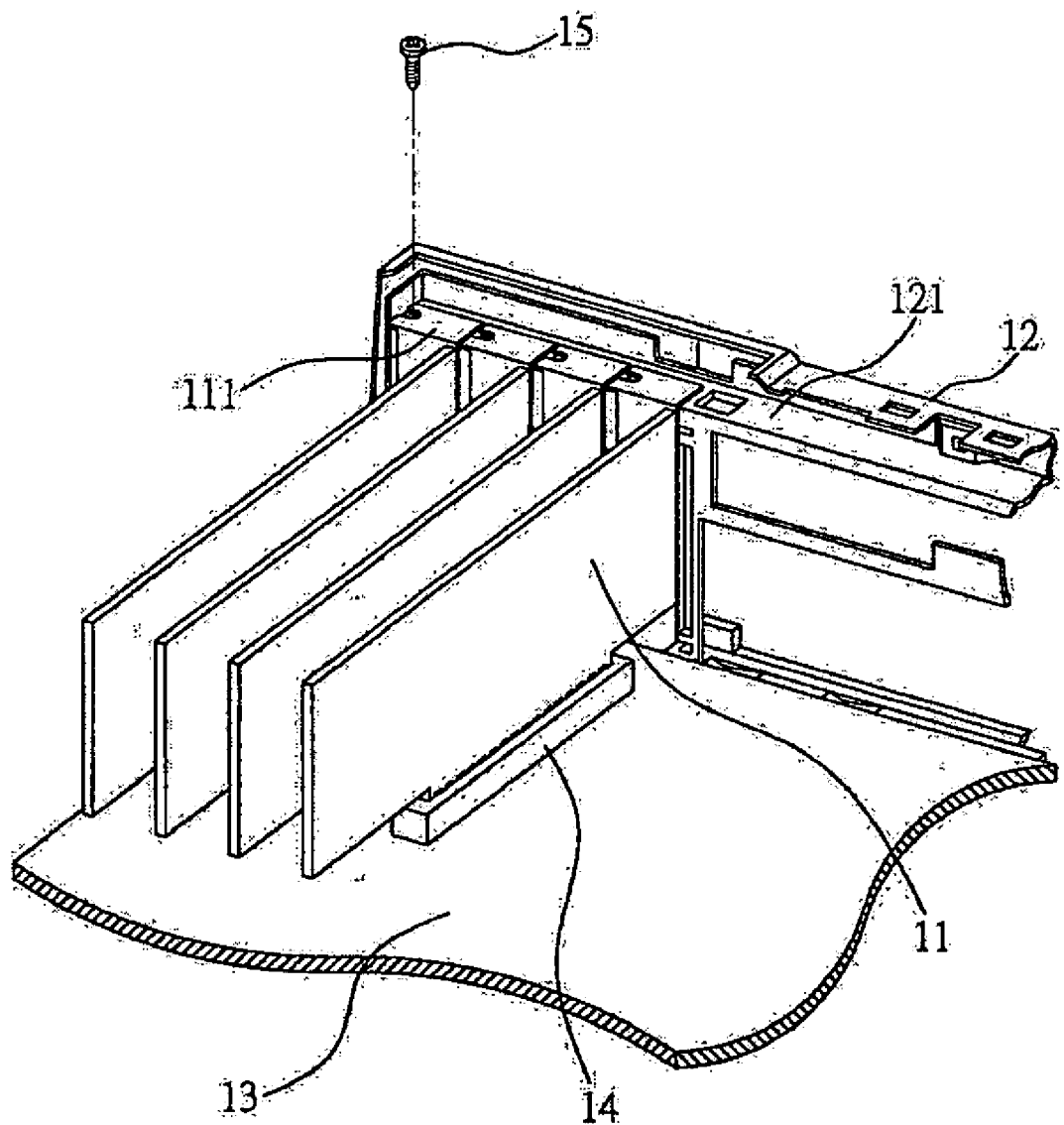
FIG. 1 is a three-dimensional view of an add-on card installed on the housing of an electronic device according to the prior art.
Figure 2A:
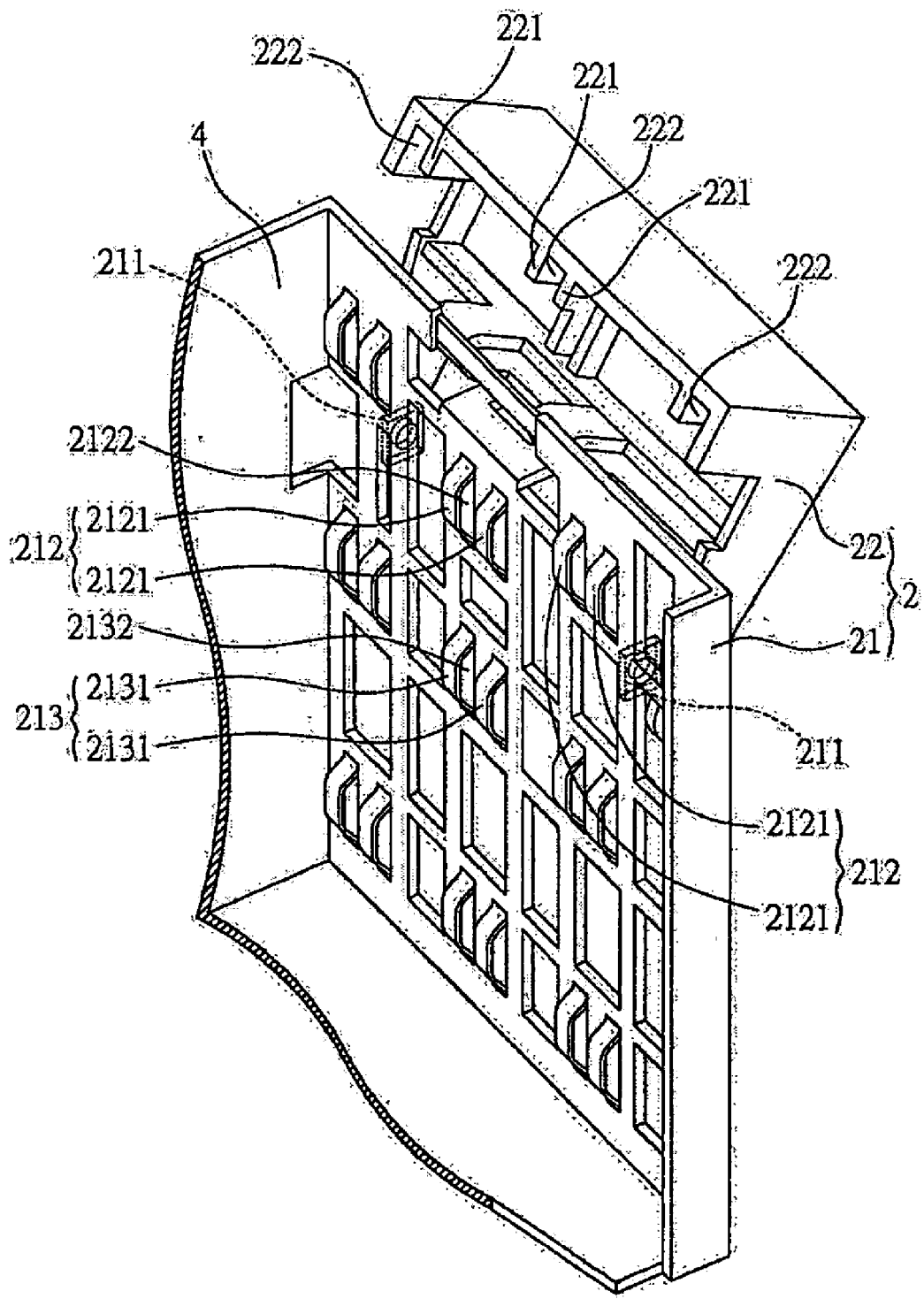
FIG. 2A is a three-dimensional view of an add-on card fastening structure free of screwing/unscrewing according to the prior art.
Figure 2B:
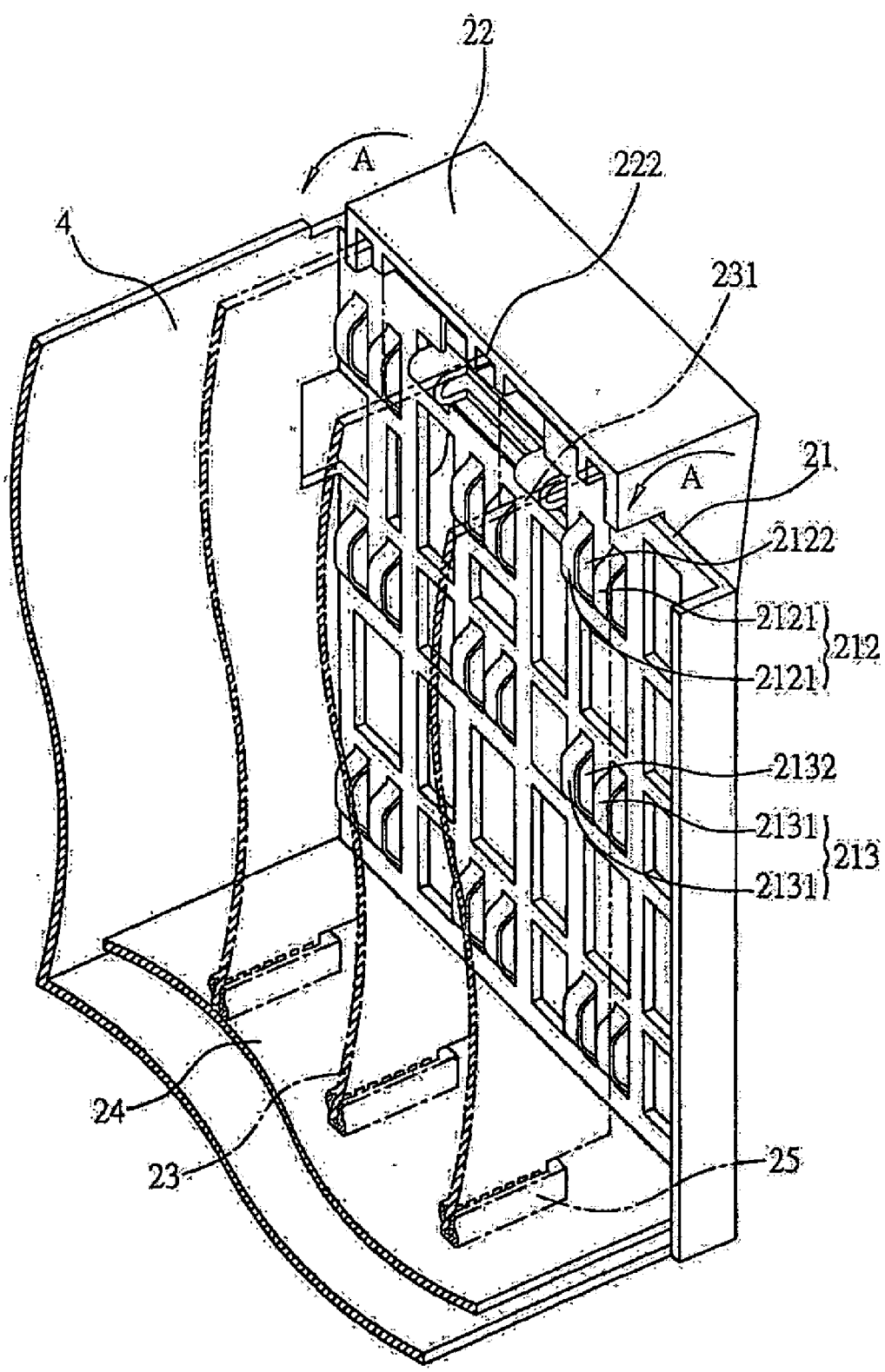
FIG. 2B is a three-dimensional view of an add-on card fastened on the housing of an electronic device, using the conventional add-on card fastening structure free of screwing/unscrewing as depicted in FIG. 2A.
Figure 3A:
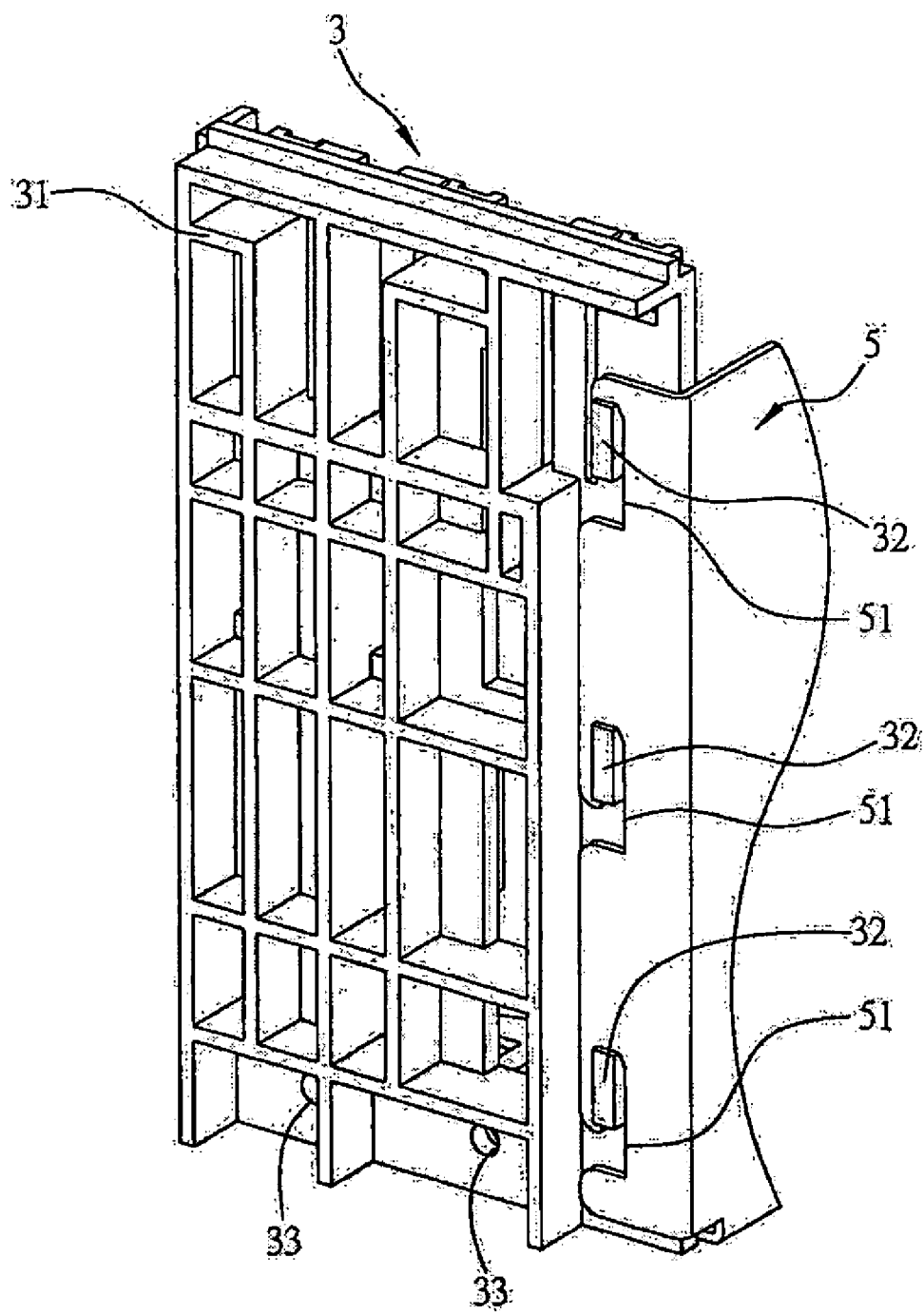
FIG. 3A is a three-dimensional view of an add-on card fastening structure fastened on the housing of an electronic device according to the present invention.
Figure 3B:
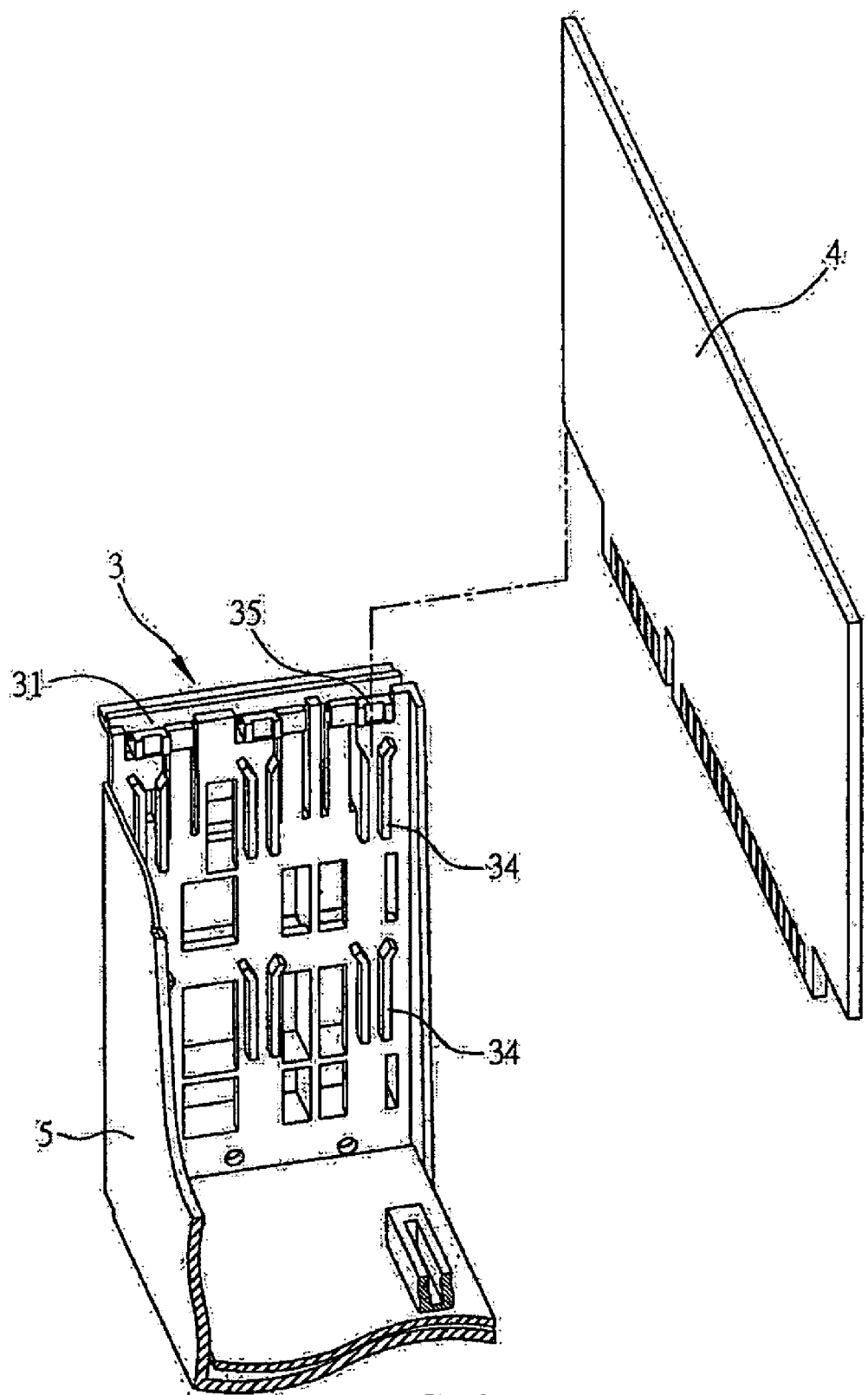
FIG. 3B is a three-dimensional view showing how to insert an add-on card into an add-on card fastening structure fastened on the housing of an electronic device according to the present invention.

Referring to FIGS. 3A and 3B, a fastening structure 3 of the present invention is integrally fabricated, comprising a body 31, a second positioning portion 32, a second coupling portion 33, confining portions 34, and a stop portion 35. Both the second positioning portion 32 and the second coupling portion 33 are disposed on the body 31. The confining portions 34, which are also disposed on the body 31, confine an add-on card 4 in the fastening structure 3.

The second positioning portion 32 is a L-shaped hook which locks a first positioning portion 51 correspondingly disposed on a housing 5 of an electronic device, so as to position the fastening structure 3 on the housing 5 and prevent the fastening structure 3 from making any horizontal displacement in relation to the housing 5. The second coupling portion 33 is an opening coupled to the first coupling portion (not shown) correspondingly disposed on the housing 5, such that the coupling of the second coupling portion 33 and the first coupling portion prevents the fastening structure 3 from making any vertical displacement in relation to the housing 5. Furthermore, the first coupling portion may be a tenon or any other conventional coupling structure and therefore is subject to no specific limitation.

Figure 3C:
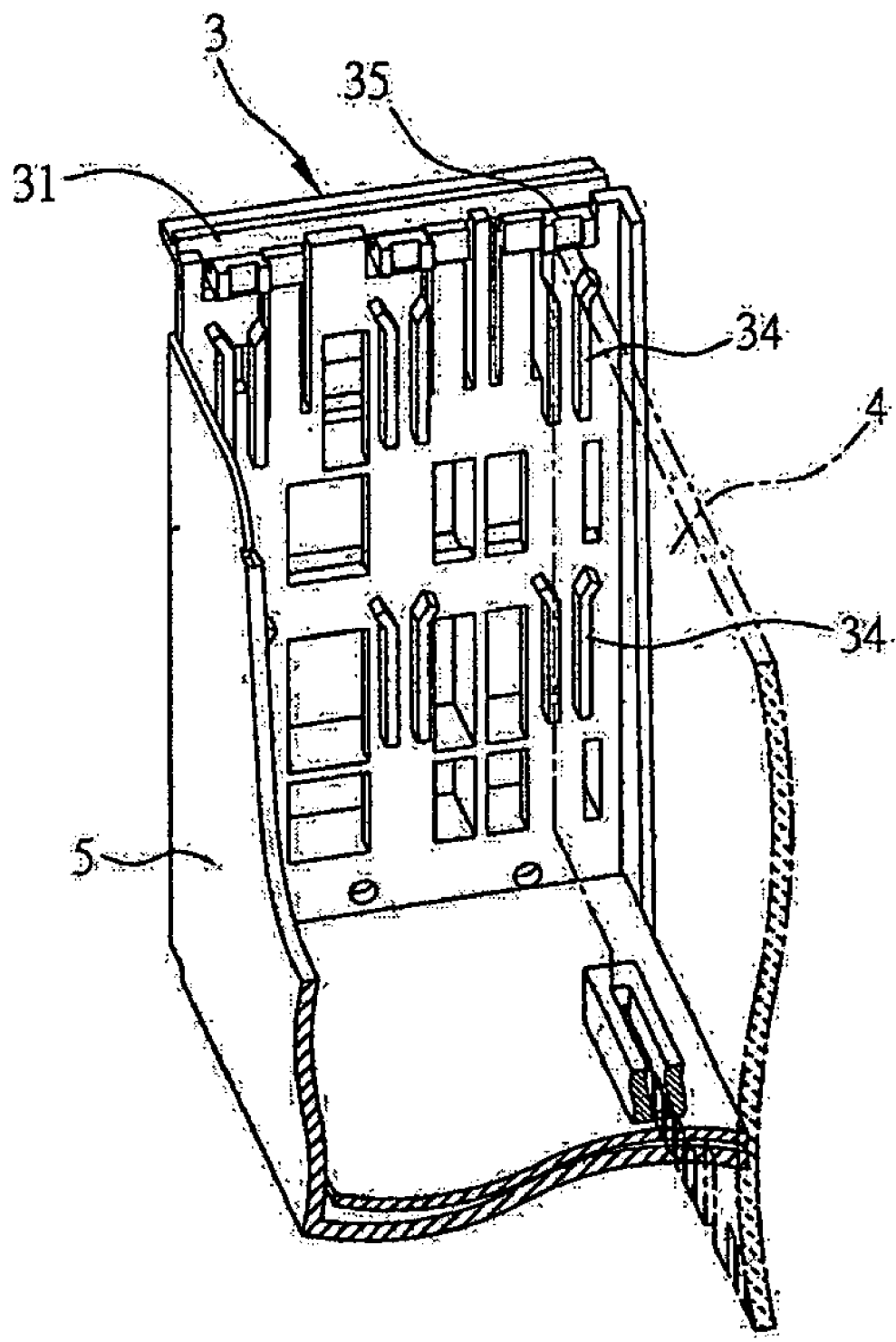
FIG. 3C is a three-dimensional view of FIG. 3B after the insertion of the add-on card into the add-on card fastening structure.

The confining portions 34 comprise a plurality of pairs of spaced-apart rails, and a guiding groove is formed between each pair of the rails, such that the add-on card 4 is disposed in the guiding grooves (not shown) and confined in the housing 5 by the confining portions 34, as shown in FIG. 3C. After the add-on card 4 is disposed in the confining portions 34, the stop portion 35 stops any displacement of the top of the add-on card 4, such that the add-on card 4 is prevented from making any vertical displacement and being disconnected from the fastening structure 3.

Owing to the coupling of the add-on card 4 to the confining portions 34 and the stop portion 35, the add-on card 4 is mounted on and dismounted from the fastening structure 3 smoothly without using any tool. On the other hand, owing to the coordinate relation between the second positioning portion 32 and the second coupling portion 33 as well as that between the first positioning portion 51 and the first coupling portion, the fastening structure 3 can be readily installed on the housing 5 without using any tool, thereby simplifying the assembly process, reducing the assembly time, and lowering the assembly cost. Moreover, the assembly cost is further reduced, because no assembly tool or locking component is required.

The aforesaid specific embodiment merely serves as a preferred embodiment of the present invention. It should not be construed as to limit the scope of the present invention in any way. Hence, any other changes can actually be made in the present invention. It will be apparent to those skilled in the art that all equivalent modifications or changes made, without departing from the spirit and the technical concepts disclosed by the present invention, should fall within the scope of the appended claims.

What is claimed is:

1. An integrated add-on card fastening structure disposed on a housing of an electronic device, for fastening an add-on card on the housing, wherein the housing is provided with a first positioning portion and a first coupling portion, the add-on card fastening structure comprising:

a body;

a second positioning portion disposed on the body, for being coupled to the first positioning portion of the housing so as to position the fastening structure and prevent the fastening structure from making horizontal displacement in relation to the housing;

a second coupling portion disposed on the body, for being coupled to the first coupling portion of the housing so as to position the fastening structure and prevent the fastening structure from making vertical displacement in relation to the housing;

a plurality of confining portions disposed on the body, for confining the add-on card in the fastening structure detachably; and at least one stop portion disposed on the body, for stopping displacement of a top portion of the add-on card disposed in the fastening structure by directly contacting the add-on card, so as to prevent the add-on card from being disconnected from the fastening structure.

2. The add-on card fastening structure of claim 1, wherein the body is made of plastics.

3. The add-on card fastening structure of claim 1, wherein the first positioning portion is a groove, and the second positioning portion is a hook.

4. The add-on card fastening structure of claim 3, wherein the hook is L-shaped.

5. The add-on card fastening structure of claim 1, wherein the first coupling portion is a tenon, and the second coupling portion is an opening.

6. The add-on card fastening structure of claim 1, wherein the plurality of confining portions comprise at least one pair of spaced-apart rails.

7. The add-on card fastening structure of claim 6, wherein a guiding groove is formed between the at least one pair of rails.

8. The add-on card fastening structure of claim 1, wherein the confining portions and the stop portion are aligned in a straight line.

9. A housing assembly for an electronic device, comprising:

a housing having a first positioning portion and a first coupling portion; and an integrated add-on card fastening structure for fastening an add-on card on the housing, the add-on card fastening structure comprising:

a body;

a second positioning portion disposed on the body, for being coupled to the first positioning portion of the housing so as to position the fastening structure and prevent the fastening structure from making vertical displacement in relation to the housing;

a second coupling portion disposed on the body, for being coupled to the first coupling portion of the housing so as to position the fastening structure and prevent the fastening structure from making vertical displacement in relation to the housing;

a plurality of confining portions disposed on the body, for confining the add-on card in the fastening structure detachably; and at least one stop portion disposed on the body, for stopping displacement of a top portion of the add-on card disposed in the fastening structure by directly contacting the add-on card, so as to prevent the add-on card from being disconnected from the fastening structure.

10. The housing assembly of claim 9, wherein the body is made of plastics.

11. The housing assembly of claim 9, wherein the first positioning portion is a groove, and the second positioning portion is a hook.

12. The housing assembly of claim 11, wherein the hook is L-shaped.

13. The housing assembly of claim 9, wherein the first coupling portion is a tenon, and the second coupling portion is an opening.

14. The housing assembly of claim 9, wherein the plurality of confining portions comprise at least one pair of spaced-apart rails.

15. The housing assembly of claim 14, wherein a guiding groove is formed between the at least one pair of rails.

16. The housing assembly of claim 9, wherein the confining portions and the stop portion are aligned in a straight line.

* * * * *